(12) United States Patent
Lee et al.

(10) Patent No.: US 11,567,617 B2
(45) Date of Patent: Jan. 31, 2023

(54) DISPLAY APPARATUS

(71) Applicant: Samsung Display Co., LTD., Yongin-si (KR)

(72) Inventors: Changho Lee, Busan (KR); Eunyoung Kim, Asan-si (KR); Hyeyun Han, Hwaseong-si (KR); Gyeongnam Bang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/337,586

(22) Filed: Jun. 3, 2021

(65) Prior Publication Data

US 2021/0382580 A1 Dec. 9, 2021

(30) Foreign Application Priority Data

Jun. 4, 2020 (KR) .......................... 10-2020-0067761

(51) Int. Cl.
| | | |
|---|---|---|
| *G06F 3/044* | (2006.01) | |
| *G06F 3/041* | (2006.01) | |
| *H01L 27/32* | (2006.01) | |
| *H01L 51/52* | (2006.01) | |

(52) U.S. Cl.
CPC .......... *G06F 3/0445* (2019.05); *G06F 3/0412* (2013.01); *G06F 3/0448* (2019.05); *H01L 27/323* (2013.01); *H01L 27/3276* (2013.01); *H01L 51/5237* (2013.01); *G06F 2203/04112* (2013.01)

(58) Field of Classification Search
CPC .... G06F 3/0445; G06F 3/0448; G06F 3/0412; G06F 3/044; H01L 27/323; G02F 1/13338
See application file for complete search history.

(56) References Cited

U.S. PATENT DOCUMENTS

| | | |
|---|---|---|
| 9,081,453 B2 | 7/2015 | Bulea et al. |
| 10,312,297 B2 * | 6/2019 | Lee ..................... H01L 27/3276 |
| 10,324,575 B2 | 6/2019 | Hwang et al. |
| 10,579,191 B2 | 3/2020 | Ko et al. |
| 10,592,056 B2 * | 3/2020 | Lee ..................... H01L 27/3276 |

(Continued)

FOREIGN PATENT DOCUMENTS

KR    10-2018-0131799    12/2018

*Primary Examiner* — Sardis F Azongha
(74) *Attorney, Agent, or Firm* — H.C. Park & Associates, PLC

(57) ABSTRACT

A display apparatus includes a display panel, an input sensor having an active area having a plurality of electrodes disposed therein and at least a portion of which overlaps the display area, and a non-active area which overlaps the non-display area. The active area has a central area and a peripheral area disposed outward from the central area. The plurality of electrodes include center electrodes which are disposed in the central area and peripheral electrodes which are disposed in the peripheral area and have a surface area less than that of the center electrodes. Each of the center electrodes includes a sensing pattern and a floating pattern, and each of the peripheral electrodes includes substantially only the sensing pattern. Thus, an embodiment of the inventive concept may provide the display apparatus that includes an input sensor having improved sensitivity in a peripheral area.

19 Claims, 14 Drawing Sheets

(56) References Cited

U.S. PATENT DOCUMENTS

| | | | |
|---|---|---|---|
| 10,691,238 B2* | 6/2020 | Cai | G06F 3/0412 |
| 10,698,523 B2 | 6/2020 | Jang et al. | |
| 10,809,829 B2* | 10/2020 | Lee | G06F 3/0446 |
| 10,895,945 B2* | 1/2021 | Baek | G06F 3/047 |
| 2016/0224156 A1* | 8/2016 | Ahn | G06F 3/0445 |
| 2017/0075491 A1* | 3/2017 | Ye | G06F 3/0443 |
| 2017/0185224 A1* | 6/2017 | Nagata | G06F 3/0448 |
| 2019/0294282 A1* | 9/2019 | Dun | G06F 3/0416 |
| 2020/0064955 A1* | 2/2020 | Wang | G06F 3/0443 |
| 2020/0210027 A1* | 7/2020 | Ma | G06F 3/0412 |
| 2020/0310595 A1* | 10/2020 | Akhavan Fomani | G06F 3/0446 |

* cited by examiner

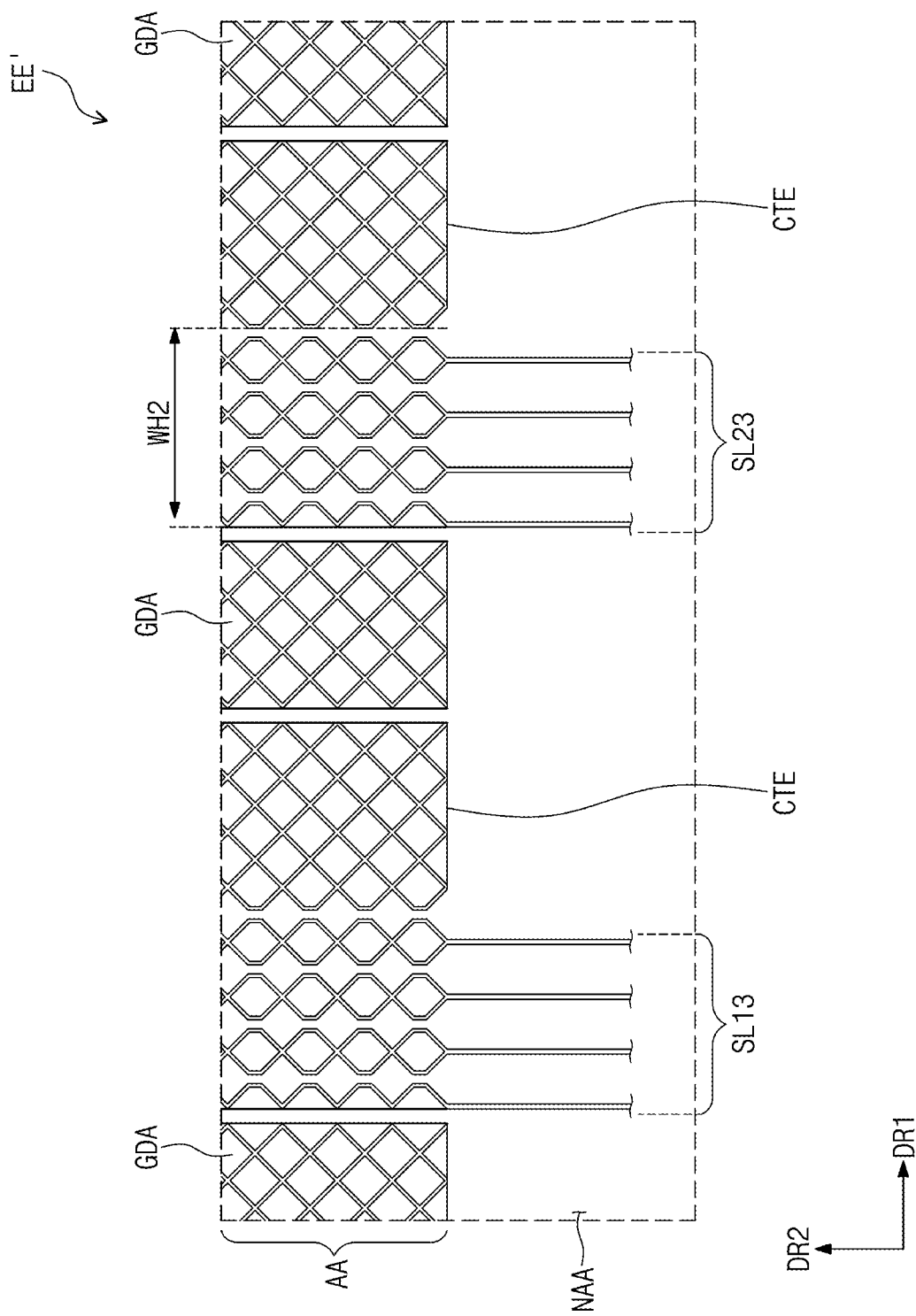

DISPLAY APPARATUS

CROSS REFERENCE TO RELATED APPLICATIONS

This application claims priority from and the benefit of Korean Patent Application No. 10-2020-0067761, filed on Jun. 4, 2020, which is hereby incorporated by reference for all purposes as if fully set forth herein.

BACKGROUND

Field

Exemplary embodiments/implementations of the invention relate generally to a display apparatus and, more specifically, to a display apparatus including an input sensor.

Discussion of the Background

Various display apparatuses used in multimedia apparatuses such as televisions, mobile phones, computers, navigation devices, and game consoles have been developed. The display apparatuses include a keyboard, a mouse, or the like as an input device. Also, recently, the display apparatuses include an input sensor as the input device.

The above information disclosed in this Background section is only for understanding of the background of the inventive concepts, and, therefore, it may contain information that does not constitute prior art.

SUMMARY

The inventive concepts provide a display apparatus that includes an input sensor having improved sensitivity in peripheral areas thereof.

Additional features of the inventive concepts will be set forth in the description which follows, and in part will be apparent from the description, or may be learned by practice of the inventive concepts.

An embodiment of the inventive concept provides a display apparatus including a display panel which has a display area configured to display an image and a non-display area adjacent to the display area; and an input sensor disposed on the display panel and having an active area, which has a plurality of electrodes disposed therein and at least a portion of which overlaps the display area, and a non-active area which overlaps the non-display area, wherein the active area has a central area and a peripheral area disposed outward from the central area, and the plurality of electrodes include a plurality of first electrodes; and a plurality of second electrodes disposed corresponding to the plurality of first electrodes, wherein the electrodes of at least one of the first electrodes or the second electrodes include center electrodes which are disposed in the central area and peripheral electrodes which are disposed in the peripheral area and have a surface area less than that of the center electrodes, wherein each of the center electrodes includes a sensing pattern and a floating pattern, and each of the peripheral electrodes includes substantially only the sensing pattern.

In an embodiment, the floating pattern may be provided in plurality, and the sensing pattern and the plurality of floating patterns may have a mesh shape.

In an embodiment, the peripheral electrodes may have round edges and may include a first peripheral electrode and a second peripheral electrode disposed further inside the input sensor in a first direction than the first peripheral electrode.

In an embodiment, the active area may be divided into a first area which overlaps the display area and a second area which partially extends from an edge of the first area to the non-active area and overlaps the non-display area, and the first peripheral electrode may include a first portion disposed in the first area and a second portion disposed in the second area.

In an embodiment, the input sensor may further include a dummy pattern disposed in the non-active area and adjacent to the edge of the second peripheral electrode, and the dummy pattern may correspond to the second portion of the first peripheral electrode.

In an embodiment, a length of the first peripheral electrode in a second direction crossing the first direction may be greater than a length of the second peripheral electrode in the second direction.

In an embodiment, the center electrodes may include a first center electrode which is adjacent to the first peripheral electrode and the second peripheral electrode and a second center electrode which is not adjacent to the first peripheral electrode and the second peripheral electrode.

In an embodiment, a surface area occupied by the floating pattern in the first center electrode may be less than a surface area occupied by the floating pattern in the second center electrode.

In an embodiment, the plurality of first electrodes and the plurality of second electrodes may define a plurality of sensor blocks, and each of the plurality of sensor blocks may include one first electrode of the plurality of first electrodes; and n second electrodes, corresponding to the one first electrode, of the plurality of second electrodes (where n is a natural number of 2 or more).

In an embodiment, the plurality of sensor blocks may include a first sensor block and a second sensor block adjacent to the first sensor block, and the first to n-th second electrodes of the first sensor block may be connected to the n-th to first second electrodes of the second sensor block, respectively.

In an embodiment, the input sensor further may include a plurality of first signal lines connected to the plurality of first electrodes.

In an embodiment, the input sensor may further include second signal lines configured to connect the first to n-th second electrodes of the first sensor block to the n-th to first second electrodes of the second sensor block, respectively.

In an embodiment, the first electrodes, the second electrodes, the first signal lines, and the second signal lines may be disposed on the same layer within the active area.

In an embodiment, the first signal lines and the second signal lines may have a mesh shape within the active area.

In an embodiment, of the first signal lines, first signal lines at least connected to the peripheral electrodes may have a straight line shape within the active area.

In an embodiment, in a plan view, a surface area occupied by the first signal lines having the straight line shape may be less than a surface area occupied by the first signal lines having the mesh shape.

In an embodiment, of the peripheral electrodes, a surface area of the peripheral electrodes connected to the first signal lines having the straight line shape may be greater than a surface area of the peripheral electrodes connected to the second signal lines having the mesh shape.

In an embodiment, of the first signal lines, the first signal lines connected to the peripheral electrodes may extend while being spaced at least about 15 um from the peripheral electrodes in the non-active area.

In an embodiment, the plurality of first electrodes and the plurality of second electrodes may be disposed on the same base surface, and the display panel may include a base substrate, a circuit layer disposed on the base substrate, a display element layer electrically connected to the circuit layer, and an encapsulation layer configured to seal the display element layer, wherein one surface of the encapsulation layer provides the base surface.

In an embodiment of the inventive concept, a display apparatus includes a display panel which has a display area configured to display an image and a non-display area adjacent to the display area; and an input sensor disposed on the display panel and having an active area, at least a portion of which overlaps the display area, and a non-active area which overlaps the non-display area, wherein the active area has a central area and a peripheral area disposed outward from the central area, and the input sensor includes, disposed in the active area a first electrode; a second electrode disposed corresponding to the first electrode; a first signal line configured to connect the first electrode; and a second signal line configured to connect the second electrode, wherein at least one electrode of the first electrode or the second electrode includes a center electrode which is disposed in the central area and a peripheral area which is disposed in the peripheral area and has a surface area less than that of the center electrode, the center electrode includes a sensing pattern and a floating pattern, and the peripheral electrode includes substantially only the sensing pattern, and the first electrode, the second electrode, the first signal line, and the second signal line are disposed on the same layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 14 is an enlarged plan view illustrating signal lines of a central area according to an embodiment of the inventive concept.

DETAILED DESCRIPTION

Figure 1:
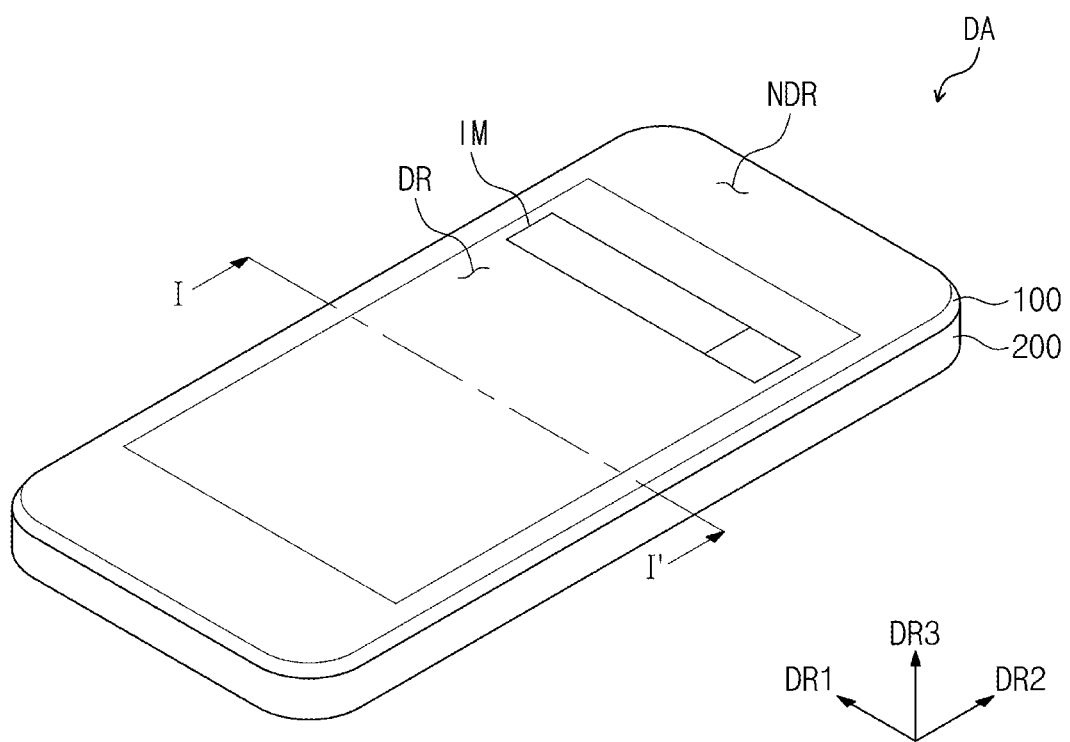
FIG. 1 is a perspective view illustrating a display apparatus according to an embodiment of the inventive concept.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

The DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. Additional axes such as Dra and DRb may be added to the cartesian coordinates and have properties similar to the axes DR1, DR2, and DR3.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

In this specification, when an element (or a region, a layer, a portion, or the like) is referred to as "being on", "being connected to", or "being coupled to" another element, it may be directly disposed/connected/coupled to another element, or an intervening third element may also be disposed therebetween.

Like numbers refer to like elements throughout. Also, in the drawings, the thicknesses, ratios, and dimensions of the elements are exaggerated for effective description of the technical contents. "And/or" includes one or more combinations which may be defined by the associated elements.

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the scope of the inventive concepts. The singular forms are intended to include the plural forms as well unless the context clearly indicates otherwise.

It will be understood that the terms "includes" or "comprises", when used in this specification, specify the presence of stated features, integers, steps, operations, elements, components, or a combination thereof, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described with reference to the accompanying drawings.

Figure 2:
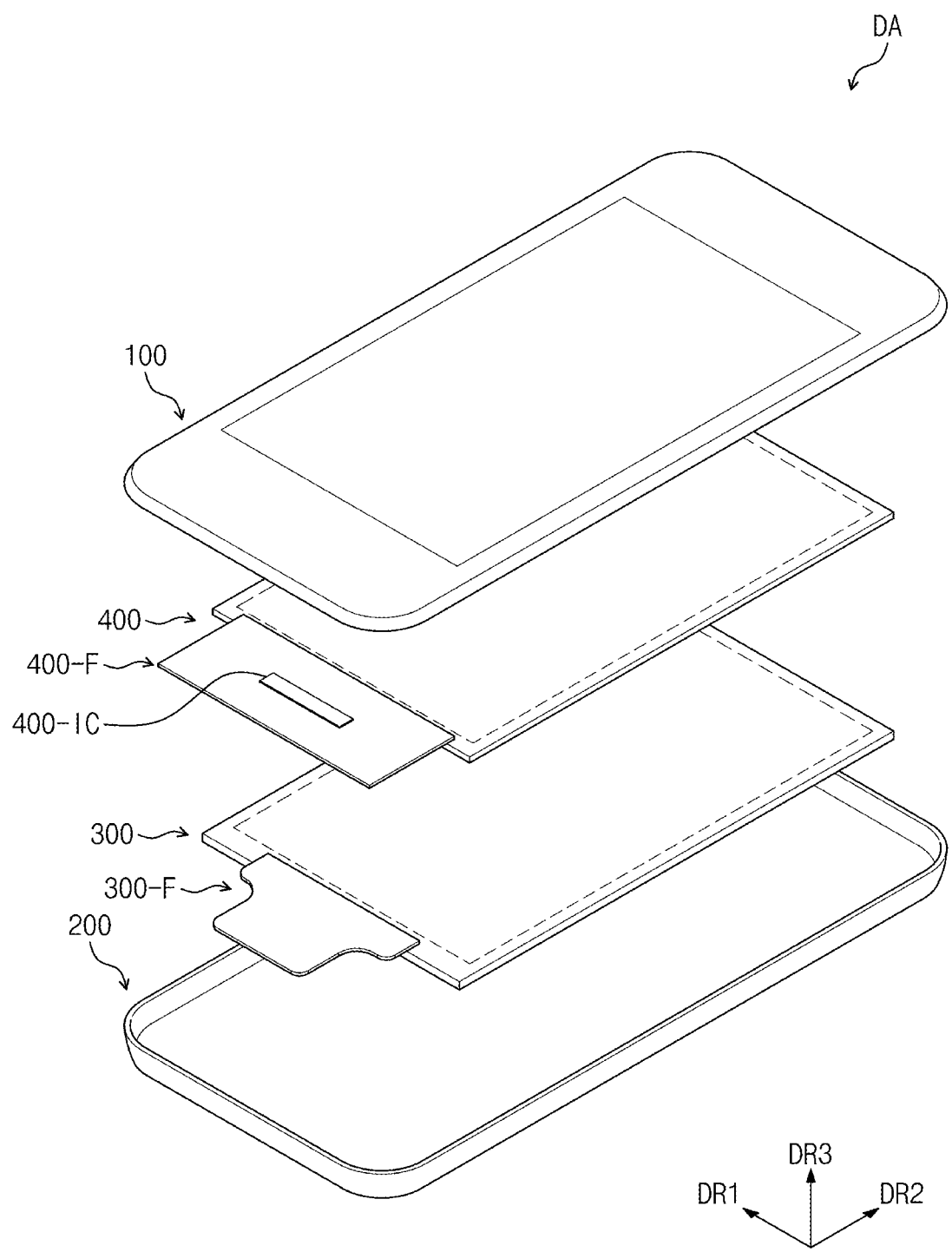
FIG. 2 is an exploded perspective view illustrating a display apparatus according to an embodiment of the inventive concept.
Figure 3:
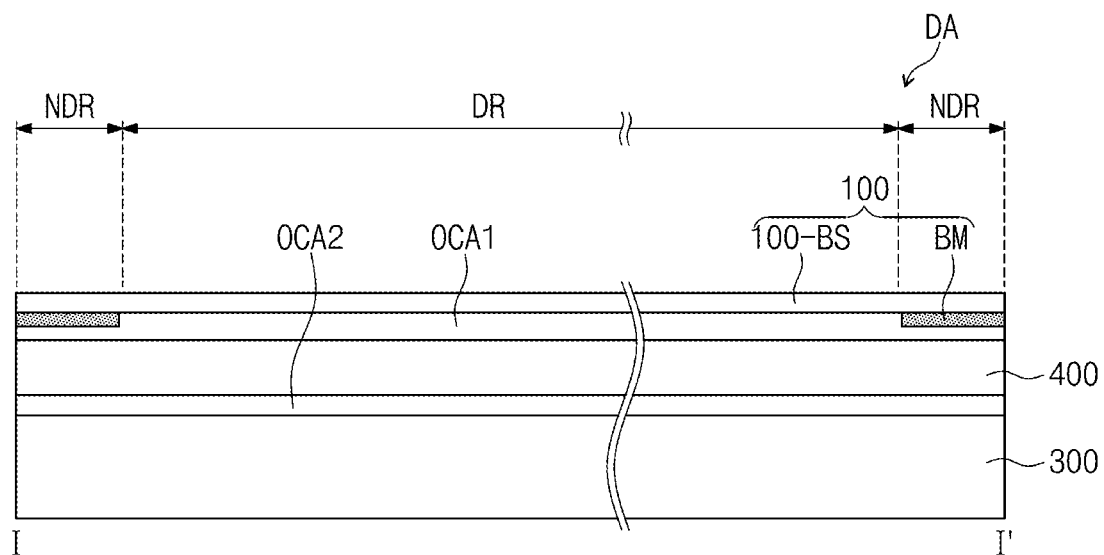
FIG. 3 is a cross-sectional view illustrating the display apparatus, taken along line I-I' of FIG. 1.
Figure 3:
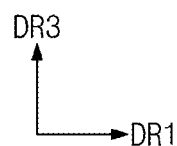

FIG. 1 is a perspective view illustrating a display apparatus DA according to an embodiment of the inventive concept. FIG. 2 is an exploded perspective view illustrating the display apparatus DA according to the embodiment of the inventive concept. FIG. 3 is a cross-sectional view illustrating the display apparatus DA, taken along line I-I' of FIG. 1. In FIG. 3, a protective frame 200 is not illustrated.

A display surface on which an image IM is displayed is parallel to a plane defined by a first directional axis DR1 and a second directional axis DR2. A direction of a normal to the display surface is indicated by a third directional axis DR3. The third direction DR3 indicates a thickness direction of the display apparatus DA. Each of the members has front and rear surfaces distinguished by the third directional axis DR3. However, directions indicated by the directional axes DR1, DR2, and DR3 have a relative concept and thus may be changed into other directions. Hereinafter, first to third directions are defined as the directions indicated by the first to third directional axes DR1, DR2, and DR3, respectively.

FIG. 1 illustrates a flat display apparatus DA as an embodiment. However, the embodiment of the inventive concept is not limited thereto, and the display apparatus DA may be a curved display apparatus having predetermined curvature, a rollable display apparatus to be rolled, and a foldable/bendable display apparatus to be folded. Although not separately illustrated, the display apparatus DA of an embodiment of the inventive concept may be used in large scale electronic apparatuses such as a television and a monitor and also in small-to-medium scale electronic apparatuses such as a mobile phone, a personal computer, a laptop computer, a personal digital terminal, a vehicle navigation unit, a game console, a portable electronic device, a wrist watch-type electronic device, and a camera.

As illustrated in FIG. 1, the display apparatus DA includes a plurality of areas distinguished on the display surface. The display apparatus DA includes a display area DR on which an image IM is displayed and a non-display area NDR adjacent to the display area DR. In FIG. 1, Internet search window is illustrated as one example of the image IM. As one example, the display apparatus DR may have a quadrilateral shape. The non-display area NDR may have a shape surrounding the display area DR. In an embodiment of the inventive concept, portions of the non-display area NDR may be disposed to face each other only in the first direction DR1 with the display area DR therebetween, or may be disposed to face each other only in the second direction DR2 with the display area DR therebetween. In an embodiment of the inventive concept, the non-display area NDR may be omitted.

As illustrated in FIGS. 2 and 3, the display apparatus DA includes a window member 100, a protective frame 200, a display panel 300, and an input sensor 400. The display apparatus DA includes a first circuit board 300-F and a second circuit board 400-F which are connected to the display panel 300 and the input sensor 400, respectively. At least one of the first circuit board 300-F or the second circuit board 400-F may be a flexible circuit board. A driving circuit 400-IC configured to drive the input sensor 400 may be mounted to the second circuit board 400-F. The driving circuit may be a driver IC. Although not separately illustrated, a driving circuit configured to drive the display panel 300, that is, a driver IC (not illustrated) may be mounted to the first circuit board 300-F.

In a plan view, each of the window member 100, the display panel 300, and the input sensor 400 may be divided into areas corresponding to the display area DR and the non-display area NDR of the display apparatus DA. FIG. 3 illustrates that the window member 100, the display panel 300, and the input sensor 400 have the same width in the first direction, but this is merely one embodiment. The widths of the window member 100, the display panel 300, and the input sensor 400 may be selectively changed.

The window member 100 includes a base member 100-BS and a black matrix BM. The black matrix BM is disposed on the rear surface of the base member 100-BS to define the non-display area NDR. The base member 100-BS may include a glass substrate, a sapphire substrate, a plastic film, and the like. The black matrix BM is a color organic layer and may be formed, for example, in a coating method. Although not separately illustrated, the window member 100 may further include a functional coating layer disposed on a front surface of the base member 100-BS. The functional coating layer may include an anti-fingerprint layer, an anti-reflection layer, and a hard coating layer.

The protective frame 200 may be coupled to the window member 100 so as to accommodate the display panel 300 and the input sensor 400. The protective frame 200 may include a plurality of parts assembled to each other or may include a single body formed by injection/compression/extrusion molding. The protective frame 200 may include a plastic or a metal. In an embodiment of the inventive concept, the protective frame 200 may be omitted.

The display surface 300 may include the display area DR and the non-display area NDR adjacent to the display area DR. The display panel 300 generates the image IM corresponding to inputted image data. The display panel 300 may be a liquid crystal display panel or an organic light emitting display panel, but the embodiment of the inventive concept is not limited to types of the display panel 300. The embodiment of the inventive concept will be described with the organic light emitting display panel as an example. Also, the organic light emitting display panel will be described later in detail.

The input sensor 400 acquires coordinate information on an input point. In the embodiment, the input sensor 400 may be a capacitive input sensor. The input sensor 400 will be described later in detail.

The window member 100 and the input sensor 400 may be coupled to each other by an optically clear adhesive film OCA1. Also, the input sensor 400 and the display panel 300 may be coupled to each other by an optically clear adhesive film OCA2. In an embodiment of the inventive concept, one of the two optically clear adhesive films OCA1 and OCA2 may be omitted. For example, the input sensor 400 and the display panel 300 are manufactured through continuous processes, and thus, the input sensor 400 may be disposed directly on the display panel 300.

Figure 4:
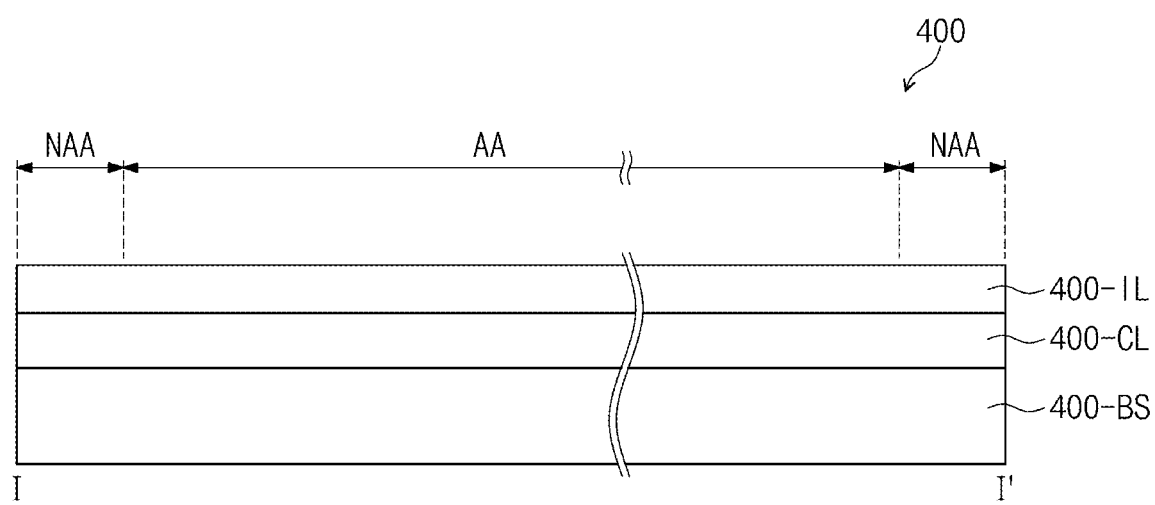
FIG. 4 is an enlarged cross-sectional view illustrating an input sensor according to an embodiment of the inventive concept.
Figure 4:
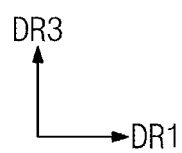
Figure 5:
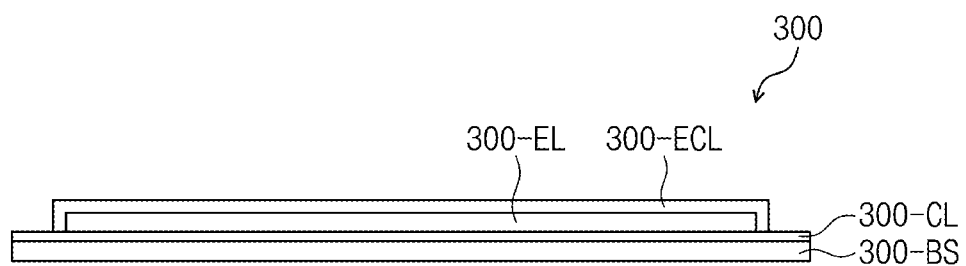
FIG. 5 is an enlarged cross-sectional view illustrating a display panel according to an embodiment of the inventive concept.
Figure 5:
Figure 6:
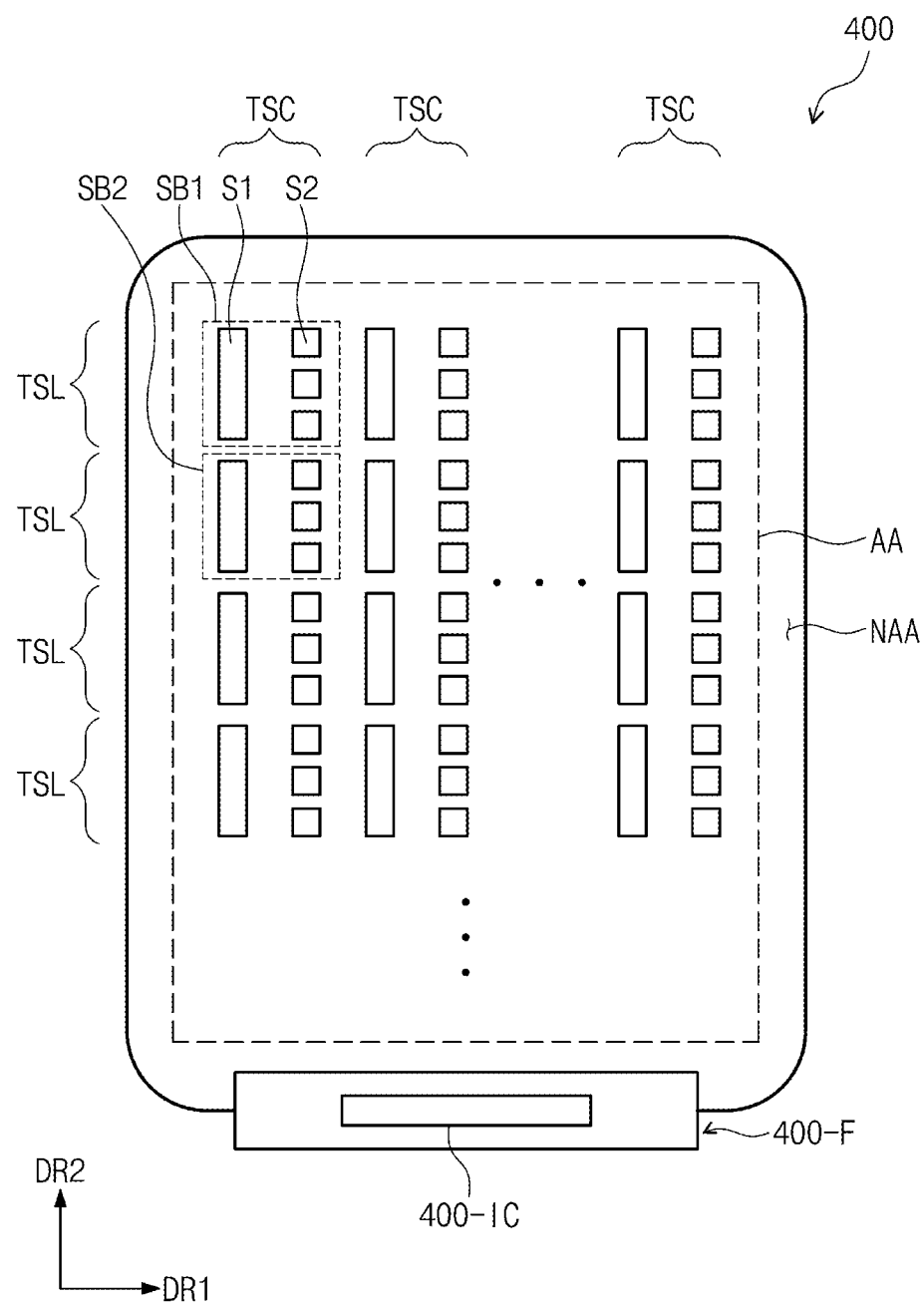
FIG. 6 is a plan view illustrating an input sensor according to an embodiment of the inventive concept.
Figure 7:
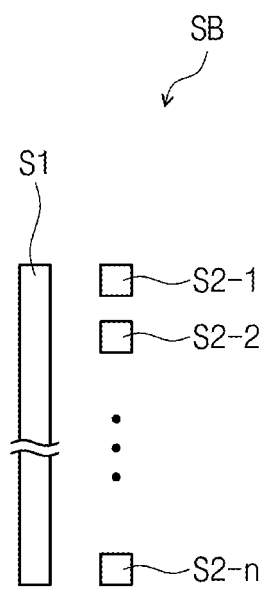
FIG. 7 is a plan view illustrating a sensor block according to an embodiment of the inventive concept.
Figure 7:
Figure 8:
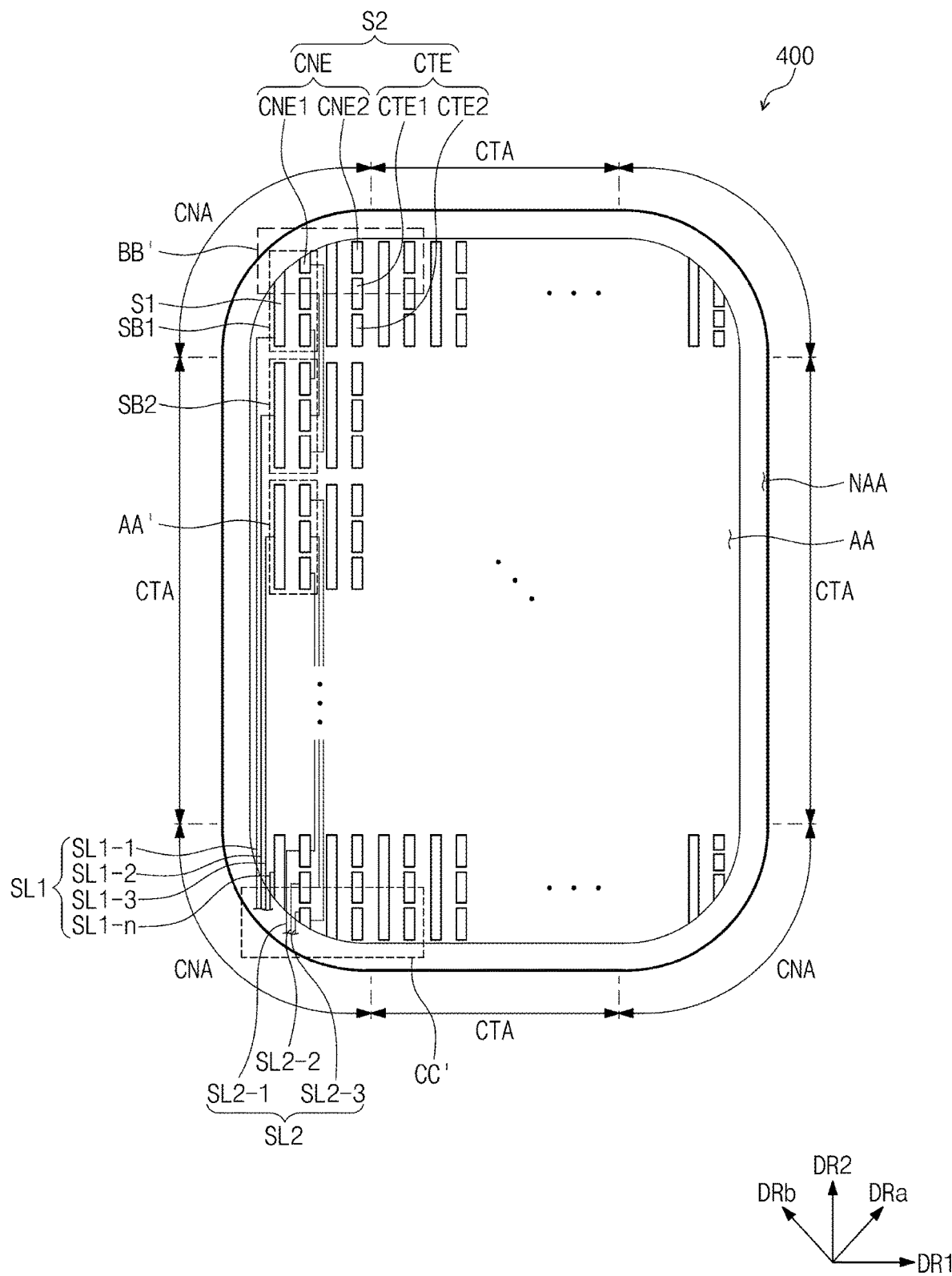
FIG. 8 is an enlarged plan view illustrating an input sensor according to an embodiment of the inventive concept.

FIG. 4 is an enlarged cross-sectional view illustrating an input sensor 400 according to an embodiment of the inventive concept. FIG. 5 is an enlarged cross-sectional view illustrating a display panel 300. FIG. 6 is a plan view of an input sensor 400 according to an embodiment of the inventive concept. FIG. 7 is a plan view illustrating a sensor block SB according to an embodiment of the inventive concept. FIG. 8 is an enlarged plan view illustrating an input sensor 400 according to an embodiment of the inventive concept. Hereinafter, an input sensor 400 according to an embodiment of the inventive concept will be described in more detail with reference to FIGS. 4 to 8.

Referring to FIG. 4, the input sensor 400 includes a base member 400-BS, a conductive layer 400-CL, and an insulating layer 400-IL. The input sensor 400 may include an active area AA and a non-active area NAA, which correspond to the display area DR and the non-display area NDR of the display panel 300. The input sensor 400 according to the embodiment may be a 1-layer capacitive input sen]olsor including the one conductive layer 400-CL. The 1-layer capacitive input sensor may acquire coordinate information about a point touched by a self-capacitance method or a mutual-capacitance method.

The embodiment of the inventive concept is not limited to the 1-layer capacitive input sensor. In an embodiment of the inventive concept, the input sensor 400 may be a multi-layer capacitive input sensor. Also, the input sensor 400 may have different layer structures according to the areas DR and NDR. In an embodiment of the inventive concept, the display area DR may have a 1-layer structure, and the non-display area NDR may have a multi-layer structure. For example, one conductive layer may be disposed in the display area DR, and a plurality of conductive layers and a plurality of insulating layers may be alternately stacked on the non-display area NDR. Hereinafter, the embodiment of the inventive concept will be described with a 1-layer capacitive touch panel on the basis of the mutual-capacitance method.

The conductive layer 400-CL may include at least one of a transparent conductive layer or a metal layer. The transparent conductive layers may include indium tin oxide (ITO), indium zinc oxide (IZO), zinc oxide (ZnO), indium tin zinc oxide (ITZO), PEDOT, a metal nano wire, and graphene. The metal layer may include molybdenum, silver, titanium, copper, aluminum, and an alloy thereof. In an embodiment of the inventive concept, the conductive layer 400-CL may also include a plurality of transparent conductive layers or a plurality of conductive layers. In an embodiment of the inventive concept, the conductive layer 400-CL may include at least one transparent conductive layer and at least one metal layer, which are stacked in a third directional axis DR3. In an embodiment of the inventive concept, the conductive layer 400-CL may have a mesh shape. That is, a plurality of mesh holes may be defined in the conductive layer 400-CL. In an embodiment of the inventive concept, the conductive layer 400-CL may include nanowires manufactured by using the metal material described above.

The conductive layer 400-CL includes a plurality of sensing patterns disposed on one surface of the base member 400-BS. As described later, the plurality of sensing patterns may constitute a plurality of electrodes and a plurality of signal lines of the input sensor 400. The plurality of electrodes and signal lines may include the same material as or materials different from each other.

The insulating layer 400-IL may protect the plurality of sensing patterns. The insulating layer 400-IL may include an inorganic layer and/or an organic layer. The insulating layer 400-IL may have a 1-layer structure or a multi-layer structure.

FIG. 5 is an enlarged cross-sectional view of a display panel 300. As illustrated in FIG. 5, the display panel 300 may include a base member 300-BS, a circuit layer 300-CL, an element layer 300-EL, and an encapsulation layer 300-ECL. Although not separately illustrated, the display panel 300 may further include an optical member disposed on the encapsulation layer 300-ECL, for example, a phase delay plate and a polarizing plate.

The base member 300-BS may include at least one plastic film. The base member 300-BS may include two plastic films and inorganic films, a silicon nitride film, and/or a silicon oxide film, which are disposed between the two plastic films. The base member 300-BS may include at least one of polyimide (PI), polyethylene terephthalate (PET), polyethylene naphthalate (PEN), polyether sulphone (PES), or fiber reinforced plastics (FS1).

The circuit layer 300-CL include a plurality of signal lines (not shown) and electronic elements (not illustrated) provided in the display panel 300. Also, the circuit layer 300-CL includes a plurality of insulating layers (not illustrated) which insulate components such as the signal lines and the electronic elements.

The element layer 300-EL includes display elements. The element layer 300-EL includes an organic light emitting diode of a pixel. The element layer 300-EL may further include electronic elements to assist the organic light emitting diode.

The encapsulation layer 300-ECL seals the element layer 300-EL. The element layer 300-EL includes a thin film encapsulation (TFE) layer, that is, a plurality of inorganic thin films and a plurality of organic thin films. In an embodiment of the inventive concept, the encapsulation layer 300-ECL may be replaced with an encapsulation substrate. The encapsulation substrate may be disposed apart from the base member 300-BS with the element layer 300-EL therebetween. A sealing material along edges of the encapsulation substrate and the base member 300-BS defines a predetermined space.

In an embodiment of the inventive concept, the base member 400-BS (see FIG. 4) of the input sensor 400 may be disposed on the encapsulation layer 300-ECL or the encapsulation substrate. In an embodiment of the inventive concept, the conductive layer 400-CL (see FIG. 4) of the input sensor 400 may be disposed directly on the encapsulation layer 300-ECL or the encapsulation substrate. That is, the encapsulation layer 300-ECL or the encapsulation substrate may provide a base surface on which first and second electrodes S1 and S2 (see FIG. 6) are disposed. In addition, the first and second electrodes S1 and S2 may be disposed directly on another functional layer (an insulating layer, a refractive index control layer, or the like) disposed on one surface of the encapsulation layer 300-ECL or the encapsulation substrate.

FIG. 6 is a plan view illustrating an input sensor 400 according to an embodiment. As illustrated in FIG. 6, the input sensor 400 includes a plurality of sensor blocks SB (SB1 and SB2) disposed in an active area AA, but embodiments are not limited thereto. The sensor blocks SB may include a plurality of sensor blocks SB3, SB4, SBn, in the DR1 and DR2 directions in the manner of sensor blocks SB1 and SB2. The plurality of sensor blocks SB may be defined by a plurality of first electrodes S1 and a plurality of second electrodes S2. In an embodiment, one group of the first electrodes S1 and the second electrodes S2 may receive Tx signals (transmission signals), and the other group may receive Rx signals (receive signals). The plurality of sensor blocks SB include a first sensor block SB1 and a second sensor block SB2. The first sensor block SB1 and the second sensor block SB2 may be arranged in a second direction DR2. In FIG. 6, a plurality of signal lines connected to the plurality of sensor blocks SB are not illustrated. The plurality of sensor blocks SB may define a plurality of electrode columns TSC or define a plurality of electrode rows TSL. FIG. 6 illustrates the plurality of sensor blocks SB arranged in a matrix form, but the embodiment of the inventive concept is not limited thereto. Each of the plurality of electrode columns TSC may have a different number of sensor blocks SB, and each of the plurality of electrode rows TSL may have a different number of sensor blocks SB. The plurality of electrode columns TSC and/or the plurality of electrode rows TSL may be defined on one surface of the base member 400-BS (see FIG. 4) in a diagonal direction.

Each of the plurality of sensor blocks SB may include the plurality of first electrodes S1 and the plurality of second electrodes S2. In an embodiment, each of the plurality of sensor blocks SB may include one first electrode S1 and n second electrodes S2 of the plurality of the second electrodes S2 corresponding to the one first electrode S1. Here, n is a natural number of 2 or more. In FIG. 6, the sensor blocks SB, each including one integrated first electrode S1 and three second electrodes S2, are illustrated.

A second circuit board 400-F is connected to a non-active area NAA of the input sensor 400. A configuration of the second circuit board 400-F may be changed according to a configuration of the input sensor 400. Although not illustrated in detail, the input sensor 400 and the second circuit board 400-F may be electrically connected to each other by an anisotropic conductive film (ACF). In an embodiment of the inventive concept, the anisotropic conductive film may be replaced by a solder bump. A driving circuit 400-IC may generate Tx signals (transmission signals) configured to drive the input sensor 400. The Tx signals as the transmission signals may be alternate current signals which are applied to sensors. Also, the driving circuit 400-IC calculates coordinate information about an input point on the basis of Rx signals (receive signals) received from the input sensor 400. The Rx signals as the receive signals may be alternate current signals in which the Tx signals (transmission signals) are transformed by an external input.

FIG. 7 is a plan view of a sensor block SB according to an embodiment. A sensor block SB will be described in more detail with reference to FIG. 7. The sensor block SB includes a first electrode S1 and n second electrodes S2-1 to S2-n which are disposed adjacent to the first electrode S1 and arranged in a predetermined direction (where, n is a natural number of 2 or more). The n second electrodes S2-1 to S2-n constitute one part of sensor block SB.

Here, whether the sensor block SB includes "one first electrode S1" or "a plurality of first electrodes S1" is determined by the number of first electrodes S1 electrically insulated from each other. Although the first electrode S1 of the sensor block SB includes two sensing patterns, the two sensing patterns electrically connected by a touch signal line is defined as one first electrode S1. The same applies to the second electrode S2. That is, then second electrodes S2-1 to S2-*n* illustrated in FIG. 7 are electrically separated from each other.

In FIG. 7, one sensor block SB may include a plurality of second electrodes S2. Here, the plurality of second electrodes S2 may include electrodes from a first second electrode S2-1 from a n-th second electrode S2-*n*. FIG. 6 illustrates three second electrodes S2 per one sensor block SB, but the number of second electrodes S2 included in one sensor block SB is not limited thereto. A direction in which the second electrodes S2 are arranged is not particularly limited, and the direction may be substantially the same as an extension direction of the first electrode S1. The second electrodes S2 may be arranged in the second direction DR2 illustrated in FIGS. 6 and 7 or in an extension direction of an electrode column TSC illustrated in FIG. 6.

FIG. 8 is an enlarged plan view of an input sensor according to an embodiment of the inventive concept.

Referring to FIG. 8, an input sensor 400 includes an active area AA and a non-active area NAA. The active area AA overlaps the display area DR (see FIG. 3) of the display panel 300 (see FIG. 3), and the non-active area NAA overlaps the non-display area NDR (see FIG. 3). The active area AA may include a central area CTA positioned at the center and peripheral areas CNA disposed outward from the central area CTA. The central areas CTA may refer to substantially center areas of each side of the active area AA. Here, the central area CTA may be all areas except for the peripheral areas CNA within the active area AA. The peripheral areas CNA are areas corresponding to edge portions (corners) of the input sensor 400 in a plan view and may be areas in a third direction DRa and a fourth direction DRb. Here, the third direction DRa and the fourth direction DRb are diagonal directions between a first direction DR1 and a second direction DR2. The central area CTA may be an area corresponding to a central portion of the input sensor 400 surrounded by the peripheral areas CNA in a plan view.

In an embodiment, the input sensor 400 may include a plurality of electrodes. The plurality of electrodes may include a plurality of first electrodes S1 and a plurality of second electrodes S2. The plurality of second electrodes S2 may be disposed corresponding to the plurality of first electrodes S1. For example, referring to FIGS. 6 and 7, three second electrodes S2 may be disposed corresponding to one first electrode S1.

In an embodiment, the electrodes of at least one of the first electrodes S1 or the second electrodes S2 may include center electrodes CTE disposed in the central area CTA and peripheral electrodes CNE disposed in the peripheral areas CNA. FIG. 8 illustrates that the second electrodes S2 include the center electrodes CTE and the peripheral electrodes CNE, but the embodiment of the inventive concept is not limited thereto. Likewise, the first electrodes S1 may also include the center electrodes CTE and the peripheral electrodes CNE (see FIG. 10).

The input sensor 400 may include a plurality of first signal lines SL1 and a plurality of second signal lines SL2. The plurality of first signal lines SL1 may be connected to the plurality of first electrodes S1. The plurality of second signal lines SL2 may be connected to the plurality of second electrodes S2. In an embodiment, the first signal lines SL1 may include signal lines from a first first signal line SL1-1 to a n-th first signal line SL1-*n*. For example, the first signal lines SL1 may include a first first signal line SL1-1 and a second first signal line SL1-2 which are connected to a first sensor block SB1 and a second sensor block SB2, respectively. The first signal lines SL1 and the second signal lines SL2 may be connected to sensing patterns of the first electrodes S1 and sensing patterns of the second electrodes S2, respectively.

In the embodiment, the second signal lines SL2 may connect the second electrodes S2. FIG. 8 illustrates one first electrode S1 and three second electrodes S2 corresponding to the one first electrode S1. The configuration described above is one embodiment, and one first electrode S1 may be disposed corresponding to n second electrodes S2. Also, the embodiment of the inventive concept is not limited to the configurations described above, and the first electrode S1 corresponding to the plurality of second electrodes S2 may be provided in plurality. In FIG. 8, a first second signal line SL2-1 may connect a third second electrode S2-3 (see FIG. 7) of the first sensor block SB1 to a first second electrode S2-1 of the second sensor block SB2. A second second signal line SL2-2 may connect a second second electrode S2-2 of the first sensor block SB1 to a second second electrode S2-2 of the second sensor block SB2, and a third second signal line SL2-3 may connect a first second electrode S2-1 of the first sensor block SB1 to a third second electrode S2-3 of the second sensor block SB2.

In an embodiment, the first electrodes S1, the second electrodes S2, the first signal lines SL1, and the second signal lines SL2 may be disposed on the same layer within the active area AA. The first signal lines SL1 and the second signal lines SL2 may be disposed between the first electrodes S1 and the second electrodes S2. The first signal lines SL1 and the second signal lines SL2 may extend from the first electrodes S1 and the second electrodes S2, which are respectively connected to the first signal lines SL1 and the second signal lines SL2, to the non-active area NAA via the active area AA.

Figure 9:
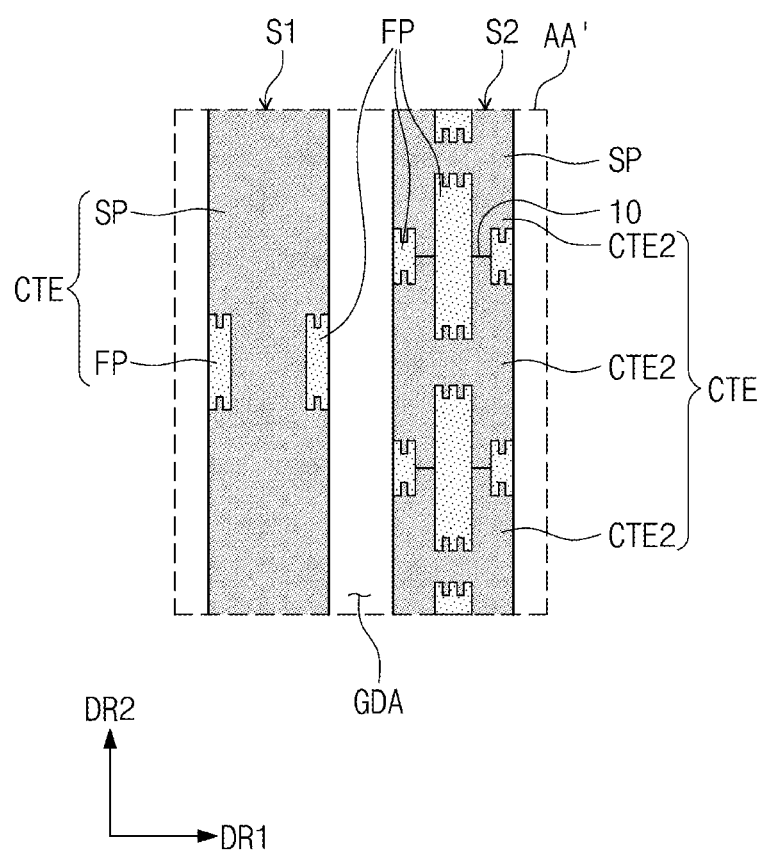
FIG. 9 is an enlarged plan view illustrating a center electrode according to an embodiment of the inventive concept.
Figure 10:
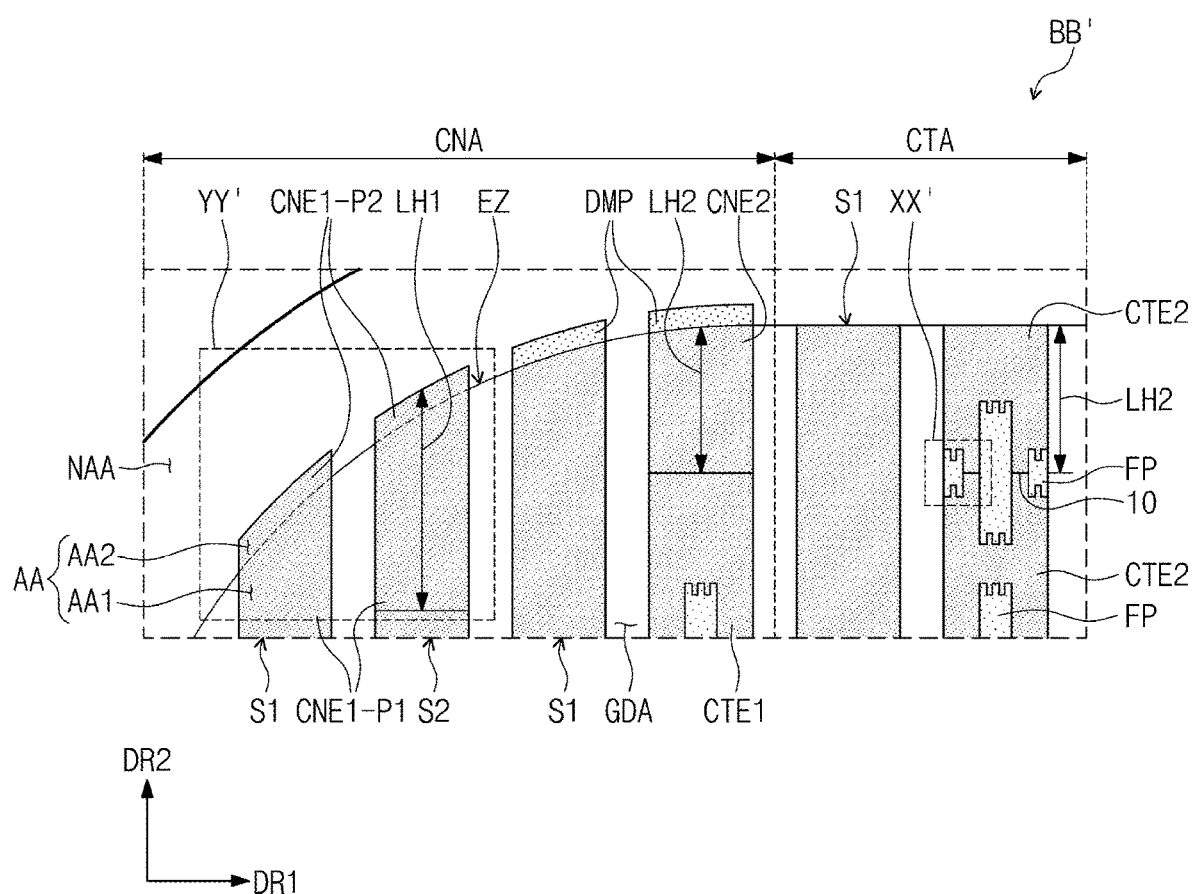
FIG. 10 is an enlarged plan view illustrating a portion of a peripheral area according to an embodiment of the inventive concept.

FIG. 9 is an enlarged plan view illustrating center electrodes according to an embodiment of the inventive concept. FIG. 10 is an enlarged plan view illustrating a portion of a peripheral area according to an embodiment of the inventive concept. Hereinafter, center electrodes CTE and peripheral electrodes CNE will be described with reference to FIGS. 9 and 10.

FIG. 9 is an enlarged view of a region AA' of FIG. 8 of a sensor block SB. Referring to FIG. 9, the center electrodes CTE may include sensing patterns SP and the floating patterns FP. Here, each of the sensing patterns SP may be a sensing part configured to sense a touch input of a user. Each of the floating patterns FP is a portion in which the sensing pattern SP is not disposed, and may be a dummy electrode portion in a state floating from the sensing pattern SP. The sensing pattern SP and the floating pattern FP may include a mesh shape. The mesh shape of the sensing pattern SP and the floating pattern FP will be described with reference to FIG. 11A. The floating pattern FP may be disposed to address a visibility limitation when the input sensor 400 is seen from the outside. The floating pattern FP may be provided in plurality. In FIG. 9, the first electrode S1 and the second electrode S2 are disposed in the central area CTA and thus may correspond to the center electrodes CTE. A center electrode CTE of FIG. 9 is not adjacent to the peripheral electrode CNE (see FIG. 8) and thus may include second center electrodes CTE2. A ground area GDA may be defined between the first electrode S1 and the second electrode S2. The ground area GDA may make the first electrode S1 and the second electrode S2 spaced apart from each other.

The floating pattern FP may be in a floating state as not to be connected to the sensing pattern SP. Unlike the center electrode CTE, a peripheral electrode CNE (see FIG. 10)

does not include a floating pattern FP and may include substantially only a sensing pattern SP.

FIG. 10 is an enlarged view of BB' of FIG. 8 including sensor blocks, the active area AA and the non-active area NAA spanning the central area CTA and peripheral area CNA. Referring to FIG. 10, a surface area of peripheral electrodes CNE may be less than a surface area of center electrodes CTE. A peripheral electrode CNE is disposed in a peripheral area CNA within an active area AA of the input sensor 400 and thus has a surface area less than that of a center electrode CTE due to a limited space. Thus, a surface area occupied by the sensing pattern of the peripheral electrode CNE is also less than that of the center electrode CTE. Embodiments of the inventive concepts are provided to improve sensitivity of the peripheral electrode CNE which is low for the above reason including the limited space thereof.

In the embodiment, the peripheral electrode CNE does not include the floating pattern FP. That is, analogous portions of the peripheral electrode CNE, which are occupied by the floating pattern FP in the center electrode CTE, do not including the floating pattern FP. That is, a surface area ratio of the sensing pattern SP area to the total area of the peripheral electrode CNE not having floating patterns FP may be greater than a surface area ratio of the sensing pattern SP area to the total area of the center electrode CTE having floating patterns.

In an embodiment, the peripheral electrode CNE may include a first peripheral electrode CNE1 and a second peripheral electrode CNE2. The second peripheral electrode CNE2 may be disposed further inside the input sensor 400 than the first peripheral electrode CNE1 in a first direction DR1. Each of the first peripheral electrode CNE1 and the second peripheral electrode CNE2 may have a round edge EZ. Curvature of the round edge of the first peripheral electrode CNE1 may be greater than curvature of the round edge of the second peripheral electrode CNE2. Particularly, the first peripheral electrode CNE1 may be disposed in a portion of the peripheral area CNA closest to the corner, and the second peripheral electrode CNE2 may be disposed closer to the center electrode CTE within the peripheral area CNA than is the first peripheral electrode CNE1. In this specification, an edge of an area may represent a border portion of the area. In an embodiment, the edge EZ of the active area AA may be a border of the active area AA. That is, the edge EZ of the active area AA may be a boundary portion between the active area AA and the non-active area NAA.

In an embodiment, a length LH1 of a first peripheral electrode CNE1 in a second direction DR2 may be greater than a length LH2 of the second peripheral electrode CNE2 in the second direction DR2. The second direction DR2 is a direction crossing the first direction DR1. In the embodiment, the first peripheral electrode CNE1 has a larger loss of surface area due to a round edge with large curvature than does the second peripheral electrode CNE2, and thus, the surface area of the sensing pattern of the first peripheral electrode CNE1 is increased by extending the length in the second direction DR2. Accordingly, the sensitivity in the peripheral area CNA may be improved.

In an embodiment, the center electrodes CTE may include a first center electrode CTE1 and a second center electrode CTE2. The first center electrode CTE1 may be disposed adjacent to the first peripheral electrode CNE1 and/or the second peripheral electrode CNE2. The second center electrode CTE2 may be disposed apart from the first peripheral electrode CNE1 and/or the second peripheral electrode CNE2.

In an embodiment, the surface area occupied by the floating pattern FP in the first center electrode CTE1 may be less than the surface area occupied by the floating pattern FP in the second center electrode CTE2. That is, floating patterns FP are removed from portions of the first center electrode CTE1 that are in contact with the first and second peripheral electrodes CNE1 and CNE2. Thus, the first center electrode CTE1 has a smaller number of floating patterns FP and larger surface area occupied by sensing patterns than the second center electrode CTE2.

In an embodiment, the active area AA may be divided into a first area AA1 and a second area AA2. The first area AA1, as an area occupying most of the active area AA, can represent the area up to the edge EZ of the active area AA. The second area AA2 may protrude from the edge EZ to the non-active area NAA and overlap the non-display area NDR (see FIG. 3) of the display panel 300 (see FIG. 3) in a plan view.

The first peripheral electrodes CNE1 may include first portions CNE1-P1 disposed in the first area AA1 and second portions CNE1-P2 disposed in the second area AA2. The input sensor 400 may include dummy patterns DMP which are disposed in the non-active area NAA and adjacent to the edges EZ of the second peripheral electrodes CNE2. In the embodiment, the first peripheral electrode CNE1 includes a round edge EZ having a large curvature, and thus, there may be a loss of surface area of the sensing pattern when compared to other electrodes. Thus, to compensate the loss of surface area, the first peripheral electrode CNE1 does not have a dummy pattern DMP unlike the second peripheral electrode CNE2, and instead includes the second portion CNE1-P2 in a position where the dummy pattern DMP is to be positioned. Thus, the surface area of the sensing pattern may be enlarged.

Figure 11A:
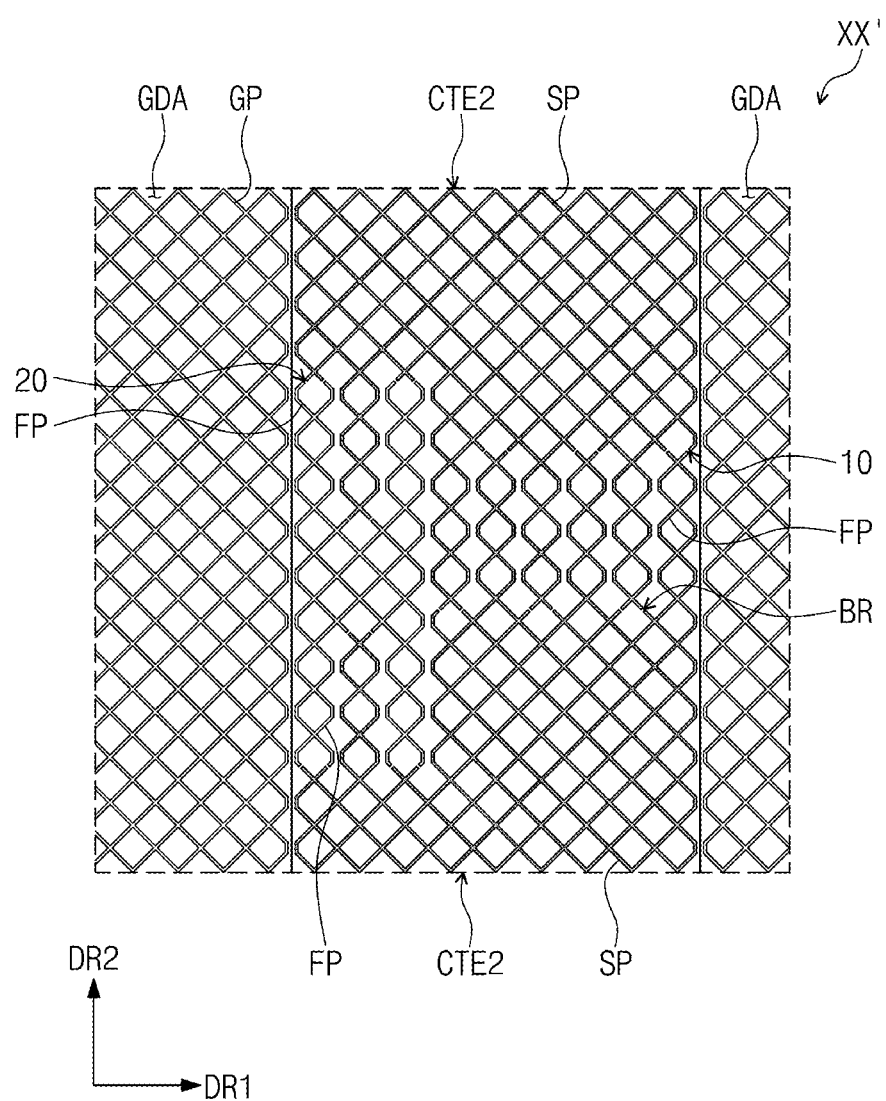
FIG. 11A is an enlarged plan view illustrating a mesh shape according to an embodiment of the inventive concept.
Figure 11B:
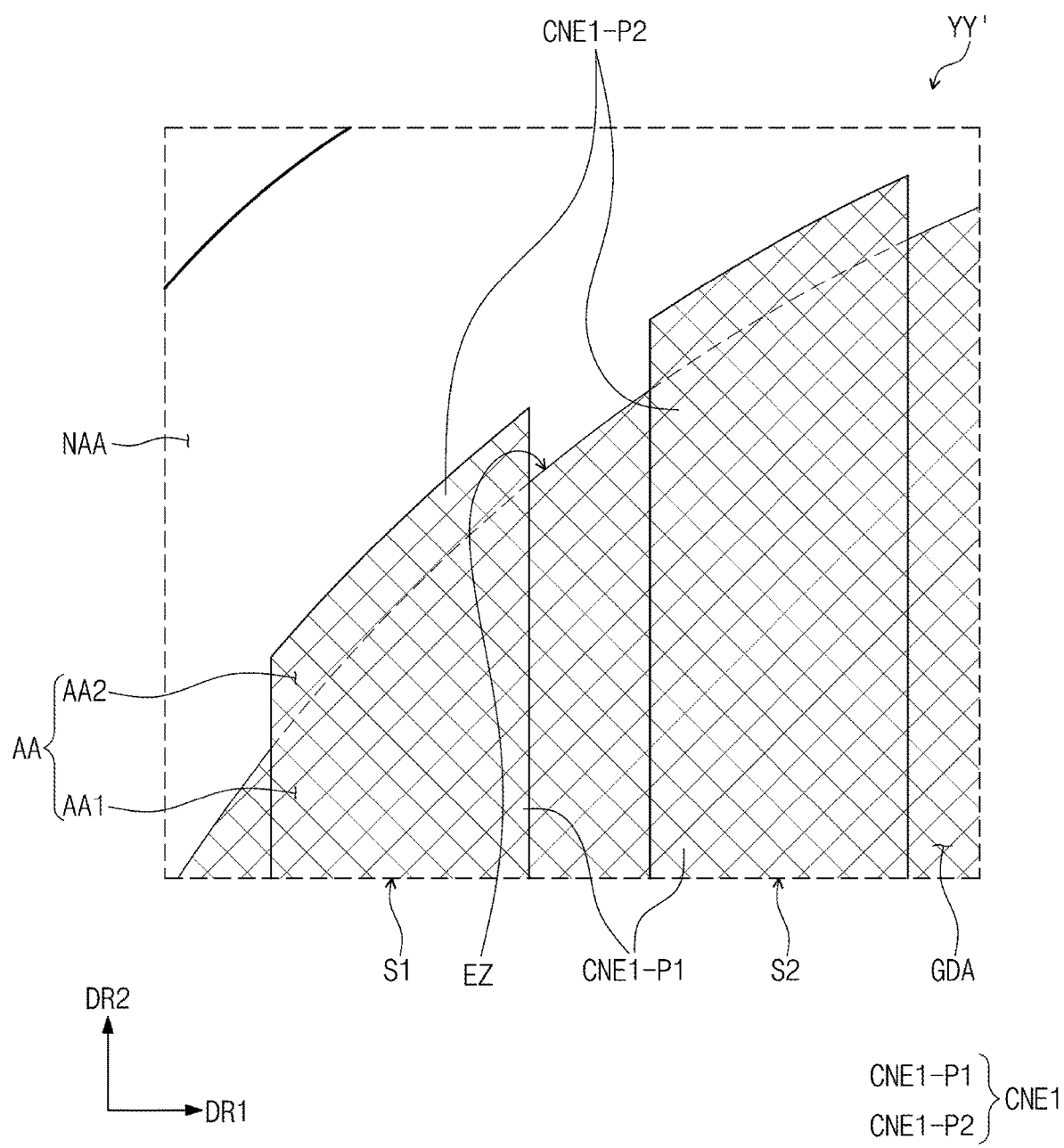
FIG. 11B is an enlarged plan view illustrating a portion of an peripheral area according to an embodiment of the inventive concept.

FIG. 11A is an enlarged plan view illustrating a mesh shape according to an embodiment of the inventive concept. FIG. 11B is an enlarged plan view illustrating a portion of an peripheral area according to an embodiment of the inventive concept. FIG. 11A is an enlarged view of XX' of FIG. 10, and FIG. 11B is an enlarged view of YY' of FIG. 10.

FIG. 11A illustrates each of second center electrodes CTE2 of the center electrodes CTE (see FIG. 8), which is apart from the peripheral electrodes CNE. In FIG. 11A, a mesh shape of a sensing pattern SP and a floating pattern FP of the second center electrode CTE2 and a mesh shape of a ground pattern GP illustrate a representative configuration of mesh shapes applied to a plurality of electrodes in the active area AA of the display apparatus according to an embodiment of the inventive concept. The ground pattern GP may be disposed in a ground area GDA and may be patterns having a mesh shape floating from the sensing pattern SP.

Referring to FIG. 11A, the center electrodes CTE2 may include sensing patterns SP and a floating patterns FP. The sensing patterns SP may have a mesh shape and the floating pattern FP may have a double-helix shape. The ground pattern GP may also have a mesh shape. In FIG. 11A, the two second center electrodes CTE2 may be separated from each other by a boundary portion 10. The boundary portion 10 may separate second electrodes, corresponding to a first electrode, from each other. The boundary portion 10 may be a cut portion of the sensing pattern SP. The sensing pattern SP in one of the second center electrodes CTE2 and the other of the second center electrodes CTE2 may be cut in the boundary portion 10. Taking into consideration the sensitivity of the sensing pattern SP, the boundary portion 10 may have a zigzag shape. Breaks BR are disposed in several places of the enlarged view XX' to illustrate where the sensing patterns SP are separated from the floating patterns FP.

The floating pattern FP may float from the sensing pattern SP. A shape of the floating pattern FP is not limited to the shape illustrated in the drawings. A cut portion 20 of the floating pattern FP may have a zigzag shape to minimize a reduction in sensitivity of the sensing pattern SP.

Referring to FIG. 11B, each of a first electrode S1 and a second electrode S2 may include a first peripheral electrode CNE1. Each of the first peripheral electrodes CNE1 may include a first portion CNE1-P1 and a second portion CNE1-P2. The second portion CNE1-P2 may be a portion protruding from an edge EZ of an active area AA to a non-active area NAA.

FIG. 11B, each of the first portion CNE1-P1 and the second portion CNE1-P2 of the first peripheral electrode CNE1 may have a mesh shape.

Figure 12:
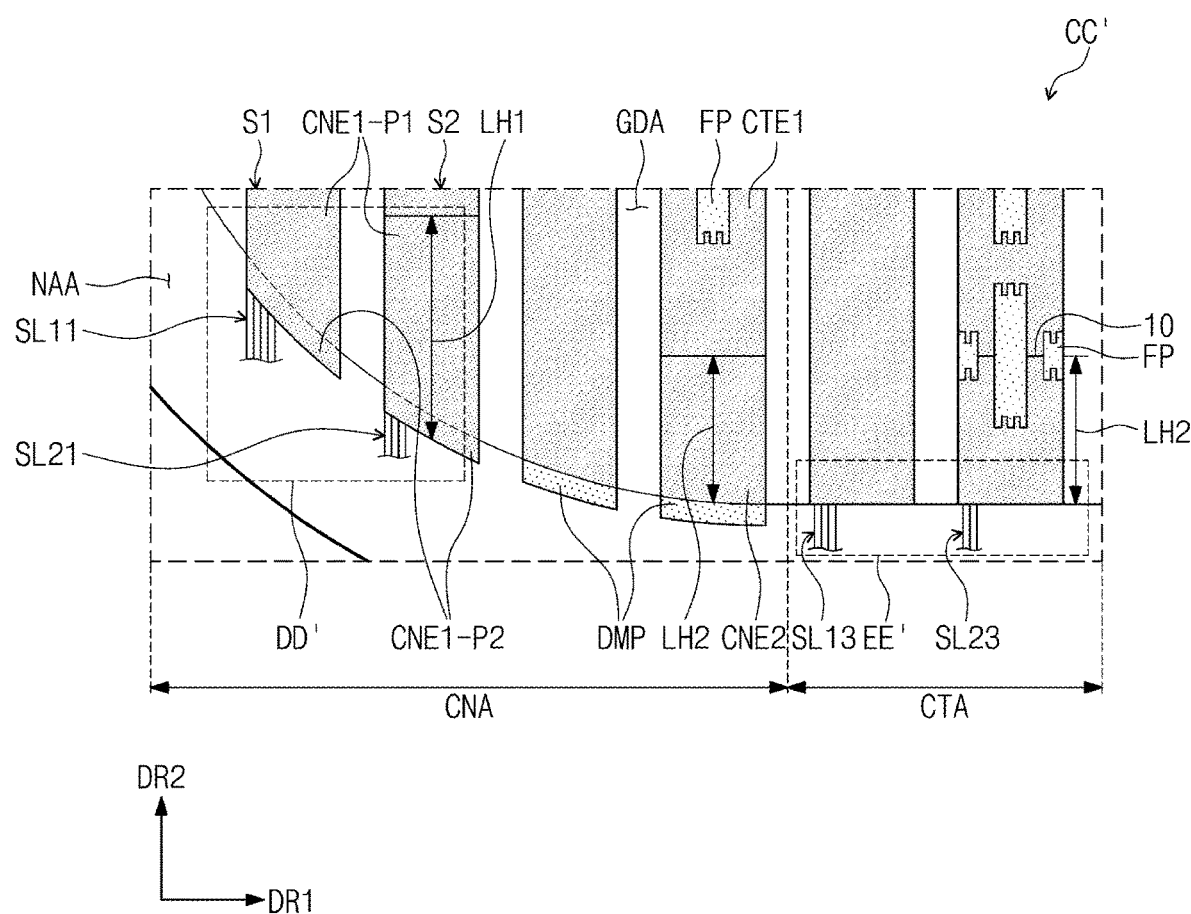
FIG. 12 is an enlarged plan view illustrating a portion of an peripheral area according to an embodiment of the inventive concept.
Figure 13:
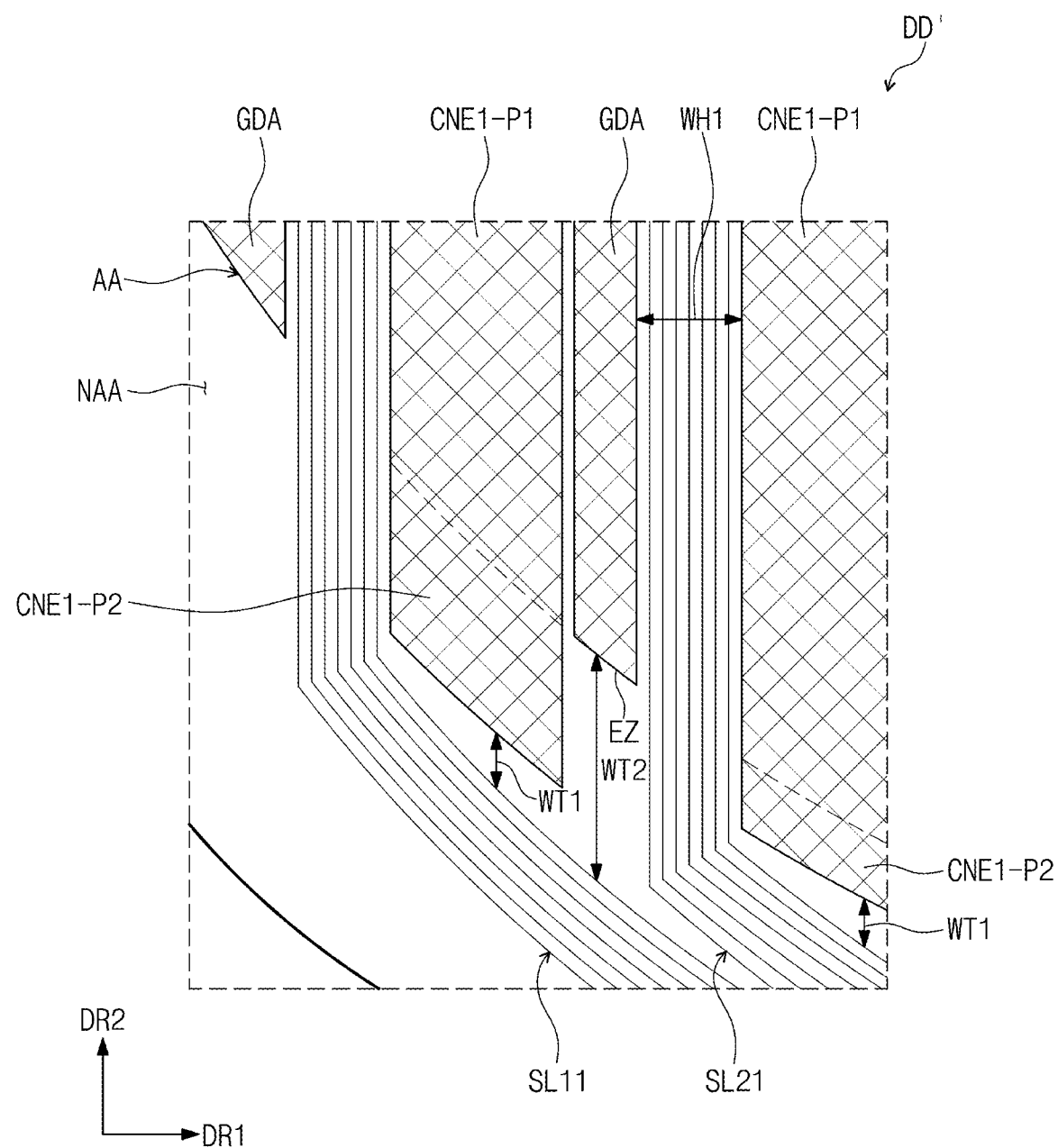
FIG. 13 is an enlarged plan view illustrating signal lines of a peripheral area according to an embodiment of the inventive concept.

FIG. 12 is an enlarged plan view illustrating a portion of a peripheral area according to an embodiment of the inventive concept. FIG. 13 is an enlarged plan view illustrating signal lines of a peripheral area according to an embodiment of the inventive concept. FIG. 14 is an enlarged plan view illustrating signal lines of a central area according to an embodiment of the inventive concept.

FIG. 12 is an enlarged view of CC' of FIG. 8. FIG. 13 is an enlarged view of DD' of FIG. 12, and FIG. 14 is an enlarged view of EE' of FIG. 12. When describing with reference to FIG. 12, descriptions overlapping with those in FIGS. 8 and 10 will be omitted.

In an embodiment, referring to FIGS. 13 and 14, the first signal lines SL1 (see FIG. 8) and the second signal lines SL2 (see FIG. 8) of an embodiment of the inventive concept may have a straight line shape or a mesh shape within an active area AA. In FIG. 13, for the first signal lines and the second signal lines, first signal lines SL11 and second signal lines SL21 at least connected to the peripheral electrodes CNE may have a straight line shape within the active area AA. In FIG. 14, for the first signal lines and the second signal lines, first signal lines SL13 and second signal lines SL23 connected to the center electrodes CTE may have a double-helix shape within the active area AA. The double-helix shape described herein may also be referred to as a figure-8 shape.

The signal lines of at least one of the first signal lines SL11 and the second signal lines SL21 connected to the peripheral electrodes CNE may have a straight line shape in the active area AA as well as in the non-active area NAA. The signal lines of at least one of the first signal lines SL13 and the second signal lines SL23 connected to the center electrodes CTE may have a straight line shape in the non-active area NAA, but may have a double-helix shape in the active area AA.

In FIGS. 13 and 14, signal lines are illustrated in different manners to compare the shape of signal lines of the peripheral area CNA and the shape of signal lines of the central area CTA. In another embodiment, unlike that illustrated in FIG. 14, the first and second signal lines SL13 and SL23 connected to the center electrode CTE of the central area CTA may also have a straight line shape within the active area AA.

That is, all of the signal lines disposed within the input sensor 400 (see FIG. 8) may have a straight line shape within the active area AA. Accordingly, the surface area occupied by the signal lines within the active area may be reduced, and the surface area occupied by the electrodes may be increased.

In a plan view, the surface area occupied by the first signal lines SL11 and/or the second signal lines SL21 having the second signal line shape is less than the surface area occupied by the first signal lines SL13 and/or the second signal lines SL23 having the double-helix shape. For example, a width WH1 of an area within the active area AA in a first direction DR1, which is occupied by the straight line-shaped second signal lines SL21 connected to the peripheral electrodes CNE, may be less than a width WH2 of an area within the active area AA in the first direction DR1, which is occupied by the double-helix-shaped second signal lines SL23 connected to the peripheral electrodes CNE.

In the embodiment of the inventive concept, the first and/or second signal lines SL11 and SL21 connected to the peripheral electrodes CNE of the peripheral area CNA have the straight line shape, and thus, the surface area occupied by the first and/or second signal lines SL11 and SL21 within the active area AA may be reduced. That is, with respect to the peripheral electrodes CNE, the surface area of the peripheral electrodes CNE connected to the first and second signal lines SL11 and SL21 having the straight line shape is greater than the surface area of the peripheral electrodes CNE connected to the first and second signal lines SL13 and SL23 having the double-helix shape.

In FIG. 13, the first signal lines SL11 of the first signal lines SL1 (see FIG. 8), which are connected to the peripheral electrodes CNE, may extend in the non-active area NAA while being spaced at least about 15 um from the peripheral electrode CNE. In the embodiment, the surface area of the sensing pattern in the first peripheral electrode CNE1 may be increased by reducing a spaced distance WT1 to the signal lines connected to the first peripheral electrode CNE1. That is, the first peripheral electrode CNE1 may be expanded such that the sensing pattern is adjacent to the first and second signal lines SL11 and SL21 by a certain distance. In the embodiment, each of the first peripheral electrodes CNE1 may include a first portion CNE1-P1 and a second portion CNE1-P2. The second portion CNE1-P2 may be a portion which extends from the first portion CNE1-P1 and protrudes to the non-active area NAA. The second portion CNE1-P2 may be at least about 15 um from the first and second signal lines SL11 and SL21. The spaced distance WT1 between the second portion CNE1-P2 and the first and second signal lines SL11 and SL21 may be less than a spaced distance WT2 between an edge EZ of the active area AA and the first and second signal lines SL11 and SL21. For example, the spaced distance WT1 between the first and second signal lines SL11 and SL21, which are connected to the first peripheral electrodes CNE1 and disposed within the non-active area NAA, and the first peripheral electrodes CNE1 may be at least about 15 um to about 20 um. In the embodiment, by using an empty space formed such that the first peripheral electrode CNE1 and the signal lines connected to the first peripheral electrode CNE1 are spaced apart from each other, the surface area of the sensing pattern of the first peripheral electrode CNE1 may be increased, and the sensitivity in the peripheral area CNA of the input sensor 400 may be enhanced.

As described above, the inventive concepts according to an embodiment may provide the display apparatus in which the electrodes disposed in the peripheral areas of the input sensor have the improved sensitivity.

In the embodiment of the inventive concept, the dummy patterns of the electrodes disposed in the peripheral area of the input sensor are removed, and the sensing patterns are disposed therein. Thus, the sensitivity of the electrode may be improved.

In the embodiment of the inventive concept, the surface area of the electrode disposed the peripheral area of the input sensor is increased. Thus, the sensitivity of the electrode may be improved.

In the embodiment of the inventive concept, the shape of the signal lines disposed in the peripheral area is changed from the mesh pattern to the line pattern. Accordingly, the surface area occupied by the signal lines is reduced, and the surface area of the sensing pattern is increased. Thus, the sensitivity of the electrode may be improved.

As described above, the embodiments were disclosed in the drawings and the specification. While specific terms were used, they were not used to limit the meaning or the scope of the inventive concept described in the claims but merely used to explain an embodiment of the inventive concept. Accordingly, those skilled in the art will understand that various modifications and other equivalent embodiments are also possible. Hence, the real protective scope of the inventive concepts shall be determined by the technical scope of the accompanying the claims.

What is claimed is:

1. A display apparatus comprising: a display panel which has a display area configured to display an image and a non-display area adjacent to the display area; and an input sensor disposed on the display panel and having an active area, which has a plurality of electrodes disposed therein and at least a portion of which overlaps the display area, and a non-active area which overlaps the non-display area, wherein: the active area has a central area and a peripheral area disposed outward from the central area; the plurality of electrodes comprises: a plurality of first electrodes; and a plurality of second electrodes disposed corresponding to the plurality of first electrodes; the electrodes of at least one of the first electrodes or the second electrodes comprise center electrodes which are disposed in the central area and peripheral electrodes which are disposed in the peripheral area and have a surface area less than that of the center electrodes; each of the center electrodes comprises a sensing pattern and a floating pattern, and each of the peripheral electrodes comprises substantially only the sensing pattern; the peripheral electrodes comprise: a first peripheral electrode including a first portion disposed in the active area and a second portion disposed in the non-active area; and a second peripheral electrode disposed further inside the input sensor than the first peripheral electrode; and the input sensor further comprises a dummy pattern disposed in the non-active area, adjacent to the edge of the second peripheral electrode, and corresponds to the second portion.

2. The display apparatus of claim 1, wherein the floating pattern is provided in plurality, the sensing pattern has a mesh shape, and the plurality of floating patterns have a double-helix shape.

3. The display apparatus of claim 1, wherein the second peripheral electrode is disposed further inside the input sensor in a first direction than the first peripheral electrode.

4. The display apparatus of claim 3, wherein the active area is divided into a first area which overlaps the display area and a second area which partially extends from an edge of the first area to the non-active area and overlaps the non-display area, and
the first portion is disposed in the first area and the second portion is disposed in the second area.

5. The display apparatus of claim 3, wherein a length of the first peripheral electrode in a second direction crossing the first direction is greater than a length of the second peripheral electrode in the second direction.

6. The display apparatus of claim 3, wherein the center electrodes comprise a first center electrode which is adjacent to the first peripheral electrode and the second peripheral electrode and a second center electrode which is not adjacent to the first peripheral electrode and the second peripheral electrode.

7. The display apparatus of claim 6, wherein a surface area occupied by the floating pattern in the first center electrode is less than a surface area occupied by the floating pattern in the second center electrode.

8. The display apparatus of claim 1, wherein the plurality of first electrodes and the plurality of second electrodes define a plurality of sensor blocks, and
each of the plurality of sensor blocks comprises:
one first electrode of the plurality of first electrodes; and
n second electrodes, corresponding to the one first electrode, of the plurality of second electrodes (where n is a natural number of 2 or more).

9. The display apparatus of claim 8, wherein the plurality of sensor blocks comprises a first sensor block and a second sensor block adjacent to the first sensor block, and
the first to n-th second electrodes of the first sensor block are connected to the n-th to first second electrodes of the second sensor block, respectively.

10. The display apparatus of claim 9, wherein the input sensor further comprises a plurality of first signal lines connected to the plurality of first electrodes.

11. The display apparatus of claim 10, wherein the input sensor further comprises second signal lines configured to connect the first to n-th second electrodes of the first sensor block to the n-th to first second electrodes of the second sensor block, respectively.

12. The display apparatus of claim 11, wherein the first electrodes, the second electrodes, the first signal lines, and the second signal lines are disposed on the same layer within the active area.

13. The display apparatus of claim 11, wherein the first signal lines and the second signal lines have a mesh shape within the active area.

14. The display apparatus of claim 13, wherein, of the first signal lines, first signal lines at least connected to the peripheral electrodes have a straight line shape within the active area.

15. The display apparatus of claim 14, wherein, in a plan view, a surface area occupied by the first signal lines having the straight line shape is less than a surface area occupied by the first signal lines having a double-helix shape.

16. The display apparatus of claim 14, wherein, of the peripheral electrodes, a surface area of the peripheral electrodes connected to the first signal lines having the straight line shape is greater than a surface area of the peripheral electrodes connected to the second signal lines having a double-helix shape.

17. The display apparatus of claim 10, wherein, of the first signal lines, the first signal lines connected to the peripheral electrodes extend while being spaced at least about 15 um from the peripheral electrodes in the non-active area.

18. The display apparatus of claim 1, wherein the plurality of first electrodes and the plurality of second electrodes are disposed on the same base surface, and
the display panel comprises a base substrate, a circuit layer disposed on the base substrate, a display element layer electrically connected to the circuit layer, and an encapsulation layer configured to seal the display element layer, wherein one surface of the encapsulation layer provides the base surface.

19. A display apparatus comprising:
a display panel which has a display area configured to display an image and a non-display area adjacent to the display area; and
an input sensor disposed on the display panel and having an active area, at least a portion of which overlaps the display area, and a non-active area which overlaps the non-display area,
wherein:
the active area has a central area and a peripheral area disposed outward from the central area;
the input sensor comprises, disposed in the active area:
 a first electrode;
 a second electrode disposed corresponding to the first electrode;
 a first signal line configured to connect the first electrode; and
 a second signal line configured to connect the second electrode;
at least one electrode of the first electrode or the second electrode comprises a center electrode which is disposed in the central area and a peripheral electrode which is disposed in the peripheral area and has a surface area less than that of the center electrode;
the center electrode comprises a sensing pattern and a floating pattern;
the peripheral electrode comprises substantially only the sensing pattern;
the first electrode, the second electrode, the first signal line, and the second signal line are disposed on the same layer;
the peripheral electrode comprises:
 a first peripheral electrode including a first portion disposed in the active area and a second portion disposed in the non-active area; and
 a second peripheral electrode disposed further inside the input sensor than the first peripheral electrode; and
the input sensor further comprises a dummy pattern disposed in the non-active area, adjacent to the edge of the second peripheral electrode, and corresponds to the second portion.

\* \* \* \* \*